United States Patent
Lin et al.

(10) Patent No.: US 6,455,782 B1
(45) Date of Patent: Sep. 24, 2002

(54) APPARATUS FOR PREVENTING CORONAL DISCHARGE

(75) Inventors: Wei-Chung Lin, Birmingham; William D. Caldwell, Bessemer, both of AL (US)

(73) Assignee: Bethea Power Products, Pelham, AL (US)

( * ) Notice: Subject to any disclaimer, the term of this patent is extended or adjusted under 35 U.S.C. 154(b) by 105 days.

(21) Appl. No.: 09/641,027

(22) Filed: Aug. 17, 2000

(51) Int. Cl.[7] .............................................. H01B 17/42

(52) U.S. Cl. .......................... 174/140 CR; 174/140 R; 174/144; 174/127

(58) Field of Search ..................... 174/140 CR, 140 R, 174/144, 140 H, 141 R, 149 R, 127; 361/117

(56) References Cited

U.S. PATENT DOCUMENTS

| | | | |
|---|---|---|---|
| 1,709,697 A | 4/1929 | Wahlberg | 174/141 |
| 4,255,615 A | 3/1981 | Huang et al. | 174/140 |
| 4,771,292 A | 9/1988 | Beach et al. | 174/140 |
| 5,552,566 A | 9/1996 | Lin et al. | 174/140 |

FOREIGN PATENT DOCUMENTS

| | | | |
|---|---|---|---|
| AT | 0220210 | 8/1961 | 174/141 |
| FR | 0888977 | 12/1943 | 174/140 |

*Primary Examiner*—Chau N. Nguyen
*Assistant Examiner*—W. David Walkenhorst
(74) *Attorney, Agent, or Firm*—India E. Vincent; Robert J. Veal; Burr & Forman LLP

(57) ABSTRACT

An improved apparatus for deconcentrating an electric field, surrounding a high voltage insulator. A clamp assembly centrally formed within a coronal ring permitting positive placement of the coronal ring about an insulator end fitting. The clamping assembly includes an integral clamp with a U-shaped opening for engaging a cylindrical portion of an insulator end fitting. Two keeper clamps are pivotally mounted superjacent to the integral clamp, each keeper clamp having a smaller U-shaped opening both of which engage a portion of the insulator end fitting and pivot toward each other between an insulator receiving position and an insulator securing position, securing the insulator between the integral clamp and the two keeper clamps. A captive fastener such as a bolt extends upwardly through the clamp and the keeper clamps to secure the keeper clamps in position against the insulator end fitting and the integral clamp to secure the corona ring in position relative the insulator end fitting. The varied sized openings of the integral clamp and keeper clamps prevent inverted installation of the corona ring.

12 Claims, 4 Drawing Sheets

APPARATUS FOR PREVENTING CORONAL DISCHARGE

FIELD OF THE INVENTION

This invention relates to an attachment for preventing coronal discharge in high voltage insulators. In greater particularity the invention relates to a coronal ring with an improved positive clamping means which allows for mounting the ring to a polymer insulator end fitting. In even greater particularity, the positive clamping means utilizes two keeping elements with secured fasteners for ease of installation especially in hot line situations.

BACKGROUND OF THE INVENTION

Corona is a discharge caused by electrical overstress in insulating materials. The occurrence of corona is often associated with the electrical failure of the insulator or insulating materials. In solids the occurrence of corona can result in the deterioration of the insulating material.

In high voltage transmission lines, the insulating material in which coronal discharge occurs is the air surrounding the conductor or insulators of the transmission line hardware. Thus, in the context of transmission lines, corona has been described by the American Standards Association as: a luminous discharge due to ionization of the air surrounding a conductor around which exists a voltage gradient exceeding a certain critical value. These discharges occur as the electrons from the intense electric field surrounding the conductor exceed a critical value. Normally, the electrons collide with air molecules such as oxygen or nitrogen and the electron bounces off with no transfer of energy to it. However, when the intensity of the electron exceeds a critical value the velocity of the electron is such that its collision with the air molecules is inelastic. Thus, an electron is knocked from an outer shell of the air molecules ionizing these molecules. The molecule with the missing ion is now a positive ion. The positive ions, e.g. nitrogen ions, are attracted toward the negative conductor in a sluggish manner due to their large size. These ions manage to capture free electrons which results in a quanta of energy being released as the energy level of a neutral molecule is less than that of the positive ion. The energy is radiated as an electromagnetic wave in the visible light range from the recombining of nitrogen ions with free electrons.

The coronal discharges result in deterioration of synthetic materials comprising insulators on transmission lines. The discharges also result in the loss of efficiency in transmitting current along such hardware and radio disturbances or interference caused such discharges. Increased expenses in the form of replacement insulators and related labor are also a result of coronal discharge.

In the past, numerous shielding and ring devices have been disclosed which spread and deconcentrate the electric field surrounding conductors and insulators to prevent coronal discharge. The majority of the control devices use some type of transverse mounting means such as a suspension clamp or a yoke plate connected to a suspension clamp to hold the control devices in place. These mounting means are complex to manipulate and utilize numerous pieces such as fasteners and U-shaped clamps. The manipulation of complicated mounting means makes installing and removing the control devices difficult for the line worker. Line workers are in a precarious work environment high in the air where the manipulation of mounting means increases the length of time it takes to complete a job. Should one of the pieces become completely disengaged and fall to the ground, the line worker must have a replacement piece handy or retrieve the missing piece from the ground in order to complete the job. Occasions may arise wherein the control devices must be installed or removed in a hot line situation and the added manipulation of the mounting means increases the risk of injury to the line worker.

One apparatus designed to simplify the mounting procedures was disclosed in U.S. Pat. No. 5,552,566. In the '566 patent, the mounting apparatus consisted of a single clamp mounted superjacent the integral clamp assembly of the corona ring. Operation of the single clamp involved one captive fastener extending through the integral clamp and the single clamp to secure the insulator end and the corona ring into appropriate positions. However, since development of that apparatus, the standard issue insulator has been redesigned, and the single mount apparatus disclosed in the '566 patent is not readily adaptable to the new insulator design. The new insulator design as disclosed in U.S. Pat. No. 5,877,453 was developed for use in extremely contaminated environments. The '453 insulator design does not fit securely into the '566 corona ring clamping means and as a result additional manipulations are required by the line workers in order to securely attach the insulator to the corona ring. As a result, there is a need in the transmission line hardware industry for an improved mounting apparatus for simple installation and removal of a corona control device or ring for use with the newer composite insulators.

SUMMARY OF THE INVENTION

It is an object of this invention to provide an improved apparatus for preventing coronal discharge in high voltage transmission insulators in which two pivotally mounted keeper mechanisms rotate simultaneously from an insulator receiving position to an insulator secured position to secure the insulator against the corona ring and in which the keeper mechanisms are secured by captive fasteners to provide for ease in installation and removal in hot line situations.

BRIEF DESCRIPTION OF THE DRAWINGS

Apparatus embodying features of the present invention are depicted in the accompanying drawings which form a portion of this disclosure and wherein.

DESCRIPTION OF THE PREFERRED EMBODIMENT

Figure 1:
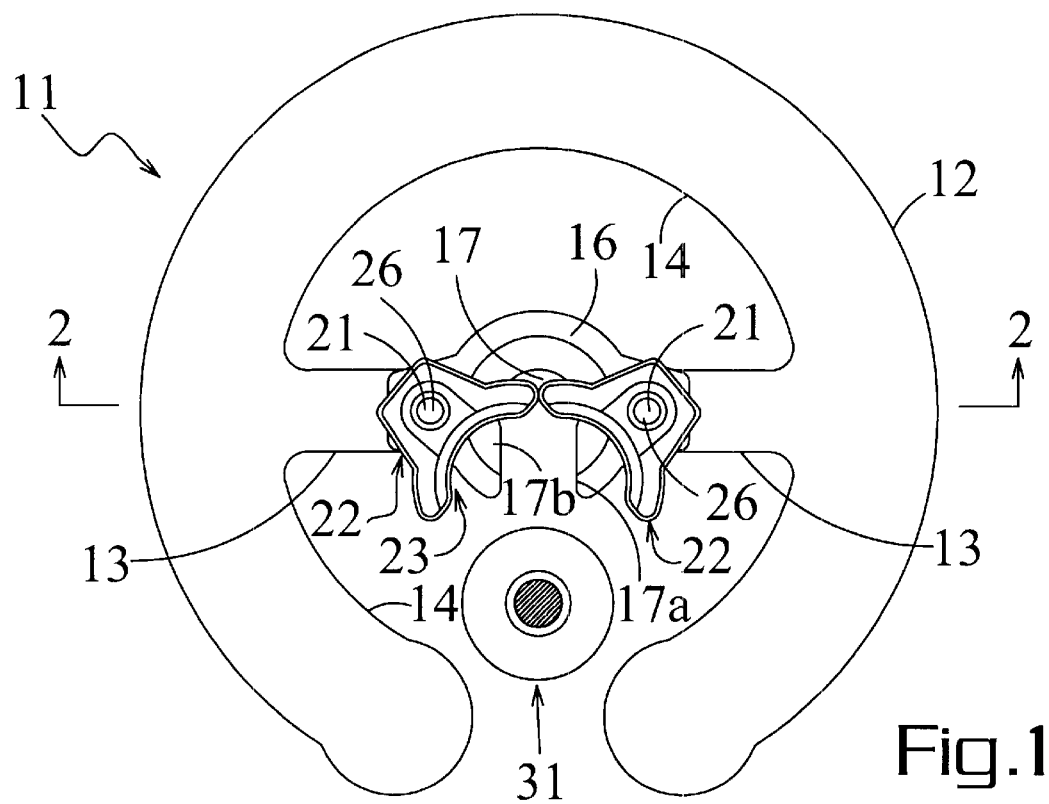
FIG. 1 is a top plan view of the corona ring assembly, in the open, unsecured position.
Figure 2:
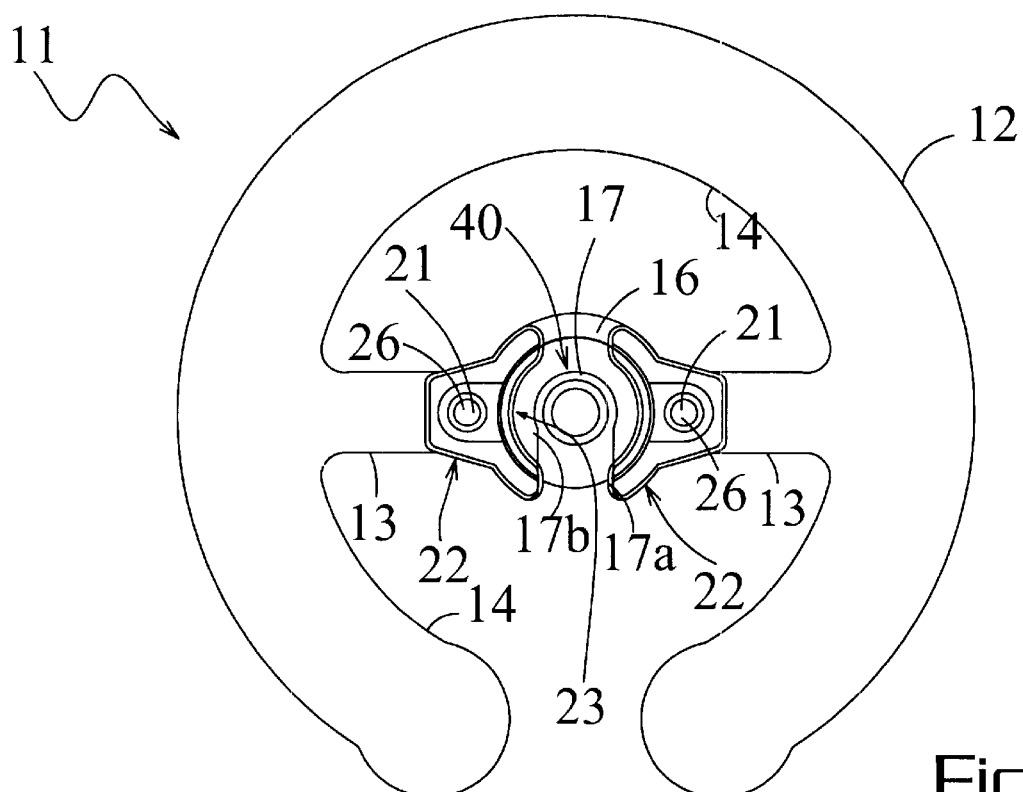
FIG. 2 is a top plan view of the corona ring assembly, in the closed, secured position.
Figure 3:
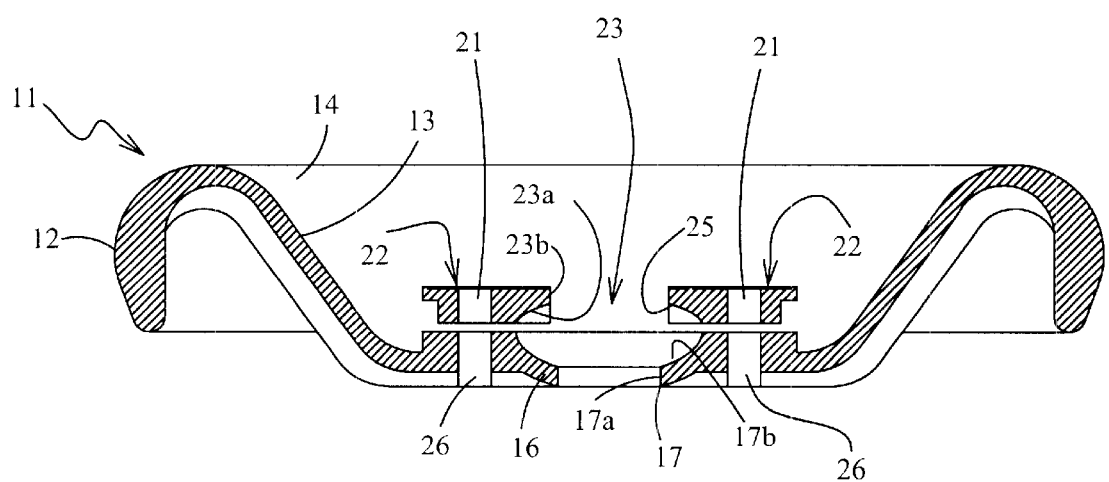
FIG. 3 is a sectional view of the corona ring and improved keeper element taken along lines 2—2 of FIG. 1.
Figure 4:
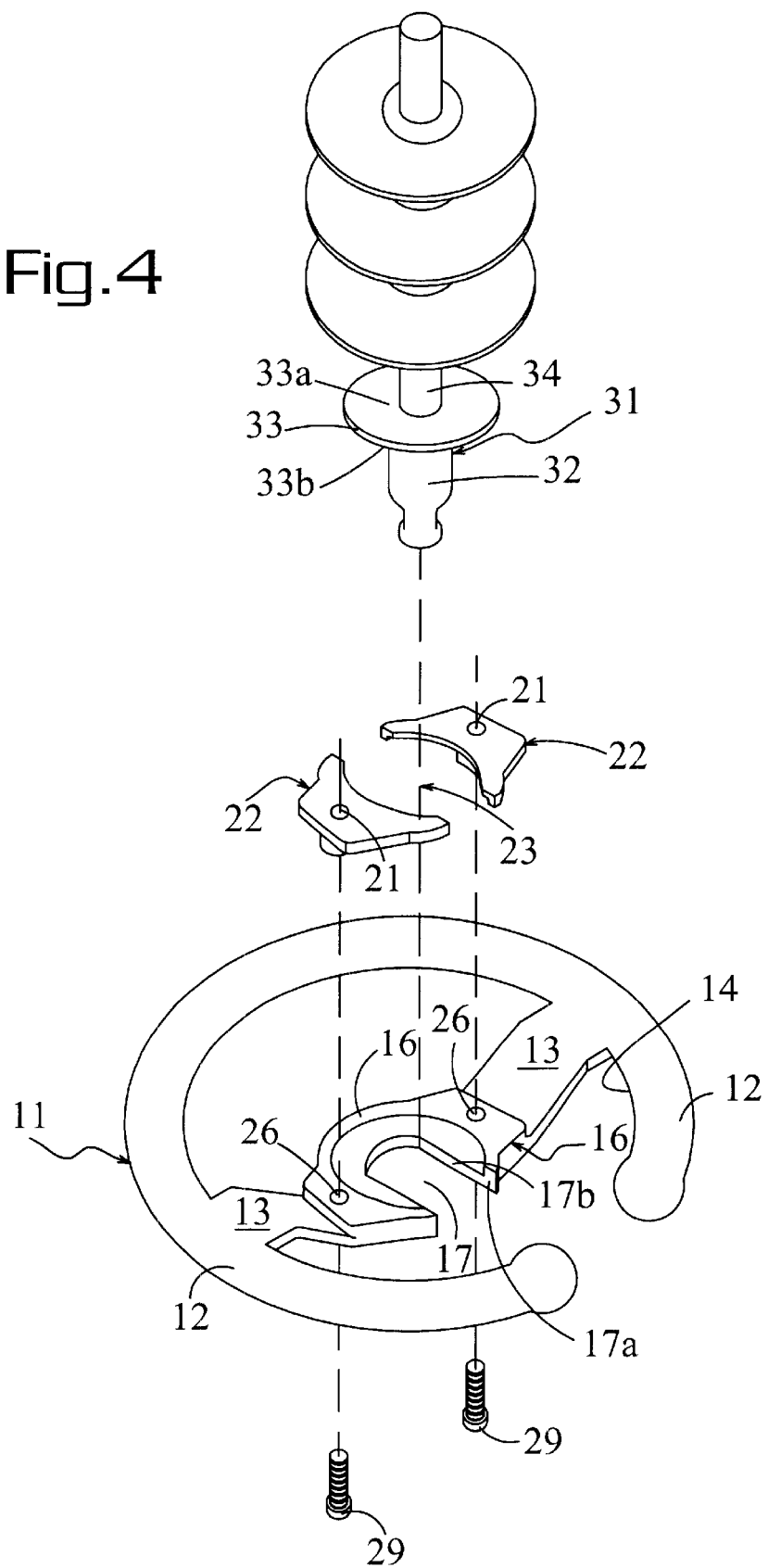
FIG. 4 is an exploded perspective view of the ring, insulator end fitting and keeper element.

Referring to the drawings for a clearer understanding of the invention a corona ring assembly 11 is shown in FIG. 1 and FIG. 2. Ring assembly 11 comprises a metallic substantially circular ring 12 that has an open area subtending a defined arc therein. A bisecting integral cross member 13 connects inner walls 14 of ring 12. The cross member 13 angles downwardly from inner edge 14 of ring 12 as is best seen in FIG. 3. The cross member 13 forms an integral clamp seat 16. The integral clamp seat 16 further defines a U-shaped receiving channel 17. Receiving channel 17 is defined by curved walls 17a and parallel side walls 17b which are spaced from each other a distance sufficient to receive therebetween an insulator end fitting 31 on which is formed an annular bell 33 as is best seen in FIG. 4. Such end fittings 31 are formed with a major diameter shank 32 on one side of bell 33 and a minor diameter shank 34 on the other side of bell 33 as shown in FIG. 4.

Figure 5:
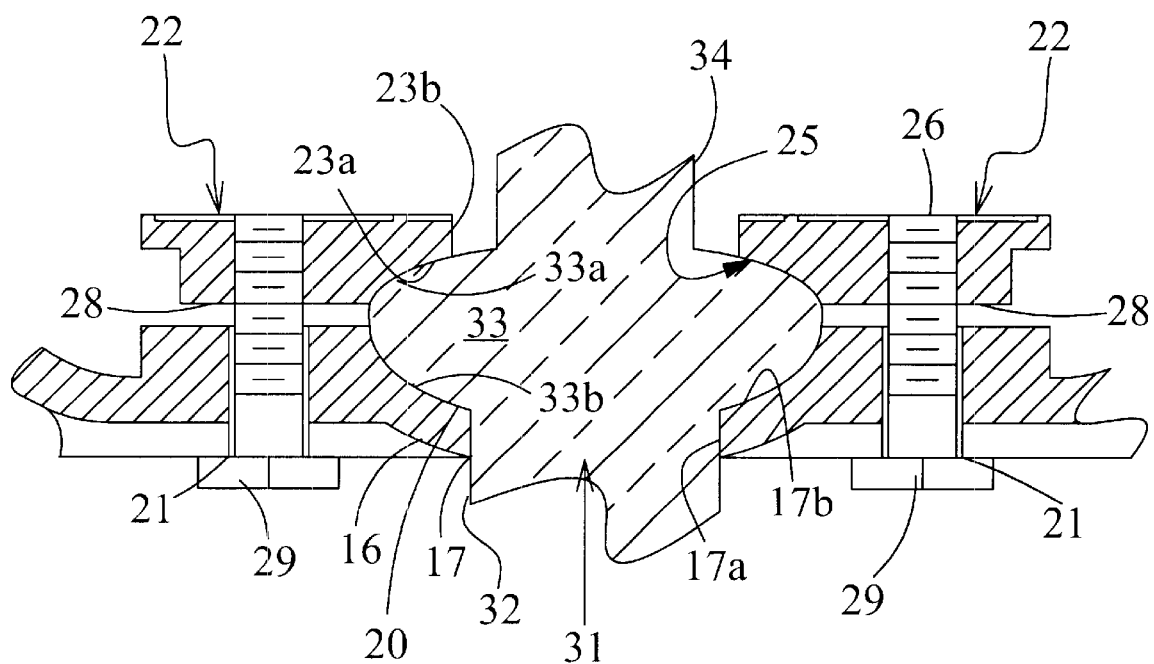
FIG. 5 is a sectional view of the clamping means of the corona ring about an insulator end fitting.

Referring to FIG. 5, clamp seat 16 is further defined by a flared surface 20 which extends from receiving channel 17, radially in relation to curved wall 17a and outward from side walls 17b such that surface 20 defines an enlarged receiving channel which can receive bell 33 of insulator end fitting 31. Receiving channel 17 opens toward and is aligned with the open segment of ring 12.

Ring 12 includes two keeper elements 22, pivotally mounted opposing one another and superjacent cross member 13. Each keeper element 22 is essentially Y-shaped, and rotates horizontally between an insulator receiving position shown in FIG. 1 and an insulator secured position shown in FIG. 2. Keeper elements 22 are mounted to receive an insulator passing through the open arc of ring 12, to contact the insulator, and to rotate in opposing directions to the secured position, fixing the insulator against clamp seat 16.

Each keeper element 22 defines a U-shaped opening 23 which is of a smaller dimension than receiving channel 17 of clamp seat 16 such that only minor diameter 34 of end fitting 31 can be received therein. Keeper elements 22 each define a U-shaped opening and the two U-shaped openings join to form a circular opening 40 having curved side walls 23a when the keeper elements are in the secured position. The distance between side walls 23b is less than that in receiving channel 17 of clamp seat 16 such that only minor diameter 34 of end fitting 31 is received between side walls 23b. A surface 25 of each keeper element 22 extends downwardly and outwardly from opening 23 to accommodate upper surface 33a of bell 33. A keeper aperture 21 is defined through each keeper element 22 immediately above and aligned with respective cross member apertures 26. Both cross member aperture 26 and aligned keeper aperture 21 are threaded. Two retaining fasteners 29 such as a threaded bolt extends upward through cross member aperture 26 and engages aligned threaded keeper aperture 21 to urge keeper element 22 in position against integral clamp seat 16. It should be noted that a single, captive fastening bolt 29 on each keeper element 22 aids in the installation and removal of ring assembly 11 in hot line situations because the line worker need not manipulate numerous fasteners or related pieces, and because the rotational movement of keeper elements 22 has already secured the corona ring to the insulator thus minimizing the manipulations required by the line operator.

Referring now to FIG. 4, ring assembly 11 is shown being installed to insulator end fitting 31. Parallel walls 17b of receiving channel 17 engage major diameter 32 of end fitting 31 just below bell 33 formed on end fitting 31. Curved walls 17a accommodate a lower surface 33b of annular bell 33. The parallel walls 23a of U-shaped opening 23 engage minor diameter 34 of end fitting 31 above annular bell 33. Fastening bolts 29 urge keeper element 22 against integral clamp seat 16 in a position about bell 33 as shown in FIG. 6. Note that ring assembly 11 can be placed on the insulator end fitting 31 in one and only one position, thereby preventing inverted installation and thus ensuring that the distance of ring assembly 11 from a conductor is correct to prevent coronal discharge.

While I have shown my invention in but one embodiment it will be obvious to those skilled in the art that it is not so limited, but is susceptible of various changes and modifications without departing from the spirit thereof.

We claim:

1. An apparatus for deconcentrating an electric field surrounding a high voltage insulator comprising:
   a corona ring; and
   a clamp assembly for mounting said corona ring to an insulator end fitting of a high voltage insulator said clamp assembly for engaging an annular bell on said insulator end fitting wherein said clamp assembly further comprises an integral cross member connecting interior edges of said corona ring, said integral cross member forming a clamp seat at a central portion of said cross member, said cross member defining a first U-shaped opening therein, two keeper clamps pivotally mounted to said clamp seat, said keeper clamps defining a second and third U-shaped opening, said second and third U-shaped opening s being of a dimension smaller than said first U-shaped opening, and fastening means for securing said keeper clamps subjacent said clamp seat, wherein said second and third U-shaped openings are capable of receiving said insulator end fitting only on one side of said bell, wherein said keeper clamps are pivotally mounted about an axis passing through the integral cross member such that said keeper clamps rotate concomitantly in opposing direction between a first fixed position for receiving said insulator end fitting and a second fixed position for securing said insulator end fitting.

2. An apparatus as defined in claim 1 wherein said first U-shaped opening is defined by a pair of parallel walls for engaging a major diameter of said insulator end fitting, said clamp seat defining a surface which extends outwardly from said first U-shaped opening to accommodate a first surface of said annular bell of said insulator end fitting.

3. An apparatus as defined in claim 1 wherein said second and third U-shaped openings each comprise a pair of parallel walls for engaging a minor diameter of said insulator end fitting formed on one side of said annular bell, said keeper clamps defining surfaces which extend outwardly from said second and third U-shaped openings to accommodate a second surface of said annular bell of said insulator end fitting.

4. An apparatus as defined in claim 1 wherein said fastening means are bolts which extend upwardly through said clamp seat and said keeper clamps through co-aligned apertures defined therein to urge said clamp seat and keeper clamp together.

5. An apparatus for deconcentrating an electric field surrounding a high voltage insulator comprising a corona ring having a integral cross member connecting inner edges of said ring, said cross member forming an integral clamp seat at center of said ring, said clamp seat defining a first U-shaped opening therein, two keeper clamps pivotally mounted superjacent said integral cross member, said keeper clamps defining second and third U-shaped openings of a dimension lesser than said first U-shaped opening, and fasteners retaining said keeper clamps adjacent said integral cross member, such that said first, second and third U-shaped openings receive there within an insulator end fitting on a high voltage insulator having a major and minor diameter, wherein said keeper clamps are pivotally mounted about an axis passing through the integral cross member such that said keeper clamps rotate concomitantly in opposing direction between a first fixed position for receiving said insulator end fitting and a second fixed position for securing said insulator end fitting against said clamp seat.

6. An apparatus as defined in claim 5 wherein said first U-shaped opening is defined by a pair of parallel walls for engaging said major diameter of said insulator end fitting, said clamp seat defining a surface which extends outwardly from said first U-shaped opening to accommodate a first surface of an annular bell of said insulator end fitting.

7. An apparatus as defined in claim 5 wherein said second and third U-shaped openings comprise a pair of parallel walls for engaging a minor diameter of said insulator end fitting, said keeper clamps defining surfaces which extend outwardly from said second and third U-shaped openings to accommodate an opposite surface of an annular bell of said insulator end fitting.

8. An apparatus as defined in claim 5 wherein each said keeper clamp is secured to said clamp seat by a single fastener which extends upwardly through said clamp seat and said keeper clamp.

9. An apparatus as defined in claim 8 wherein said fasteners are bolts extending upwardly through said clamp seat and said keeper clamps to retain said keeper clamps.

10. An apparatus for deconcentrating an electric field surrounding a high voltage insulator comprising a corona ring having an integral cross member connecting inner edges of said ring, said cross member forming a clamp seat at a center of said ring, said clamp seat defining a first U-shaped opening, said first U-shaped opening further comprising a pair of parallel walls for engaging a major diameter of an insulator end fitting, said clamp seat defining curved walls extending upwardly from said first U-shaped opening to accommodate a first surface of an annular bell of said insulator end fitting, two keeper clamps pivotally mounted on said clamp seat superjacent said cross member, said keeper clamps defining aligned second and third U-shaped openings of a dimension lesser than said first U-shaped opening, said keeper clamps rotating concomitantly in opposite directions between a first fixed position for receiving said insulator end fitting and a second fixed position for securing said insulator end fitting against said clamp seat, said second and third U-shaped openings comprising a pair of parallel walls for engaging a minor diameter of said insulator end fitting, said keeper clamps defining a surface outwardly extending from said second and third U-shaped openings to accommodate an opposite surface of said annular bell of said insulator end fitting, a fastener retaining each said keeper clamp adjacent said clamp seat.

11. An improved apparatus for deconcentrating an electric field surrounding a high voltage insulator comprising a corona ring and a clamp assembly for mounting said corona ring to an insulator end fitting of a high voltage insulator said clamp assembly for engaging an annular bell on said insulator end fitting wherein said clamp assembly further comprises an integral cross member connecting interior edges of said corona ring, said integral cross member forming a clamp seat at a central portion of said cross member, said cross member defining a first U-shaped opening therein, and a keeper mechanism wherein the improvement comprises:

two keeper clamps pivotally mounted to said clamp seat, said keeper clamps defining a second and third U-shaped opening, said second and third U-shaped openings being of a dimension smaller than said first U-shaped opening, and fastening means for securing said keeper clamps subjacent said clamp seat, wherein said second and third U-shaped openings are capable of receiving said insulator end fitting only on one side of said bell, wherein said keeper clamps are pivotally mounted about an axis passing through the integral cross member such that said keeper clamps rotate concomitantly in opposing direction between a first fixed positioning for receiving said insulator end fitting and a second fixed position for securing said insulator end fitting against said clamp seat.

12. The improved apparatus of claim 11 wherein said fastening means are bolts which extend upwardly through said clamp seat and said keeper clamps through co-aligned apertures defined therein to urge said clamp seat and keeper clamp together.

* * * * *